(12) United States Patent
Jünemann et al.

(10) Patent No.: US 9,265,151 B2
(45) Date of Patent: Feb. 16, 2016

(54) PRINTED-CIRCUIT BOARD ARRANGEMENT FOR MILLIMETER-WAVE SCANNERS

(75) Inventors: Ralf Jünemann, Munich (DE); Christian Evers, Kirchheim (DE); Andreas Schiessl, Munich (DE); Sherif Sayed Ahmed, Munich (DE); Gerd Hechtfischer, Vaterstetten (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 241 days.

(21) Appl. No.: 14/003,204

(22) PCT Filed: Feb. 2, 2012

(86) PCT No.: PCT/EP2012/051737
§ 371 (c)(1),
(2), (4) Date: Nov. 13, 2013

(87) PCT Pub. No.: WO2012/119818
PCT Pub. Date: Sep. 13, 2012

(65) Prior Publication Data
US 2014/0063754 A1 Mar. 6, 2014

(30) Foreign Application Priority Data
Mar. 4, 2011 (DE) .......................... 10 2011 005 145

(51) Int. Cl.
*H05K 1/00* (2006.01)
*H05K 1/18* (2006.01)
(Continued)

(52) U.S. Cl.
CPC ................. *H05K 1/181* (2013.01); *H01Q 1/38* (2013.01); *H01Q 9/0407* (2013.01); *H01Q 21/065* (2013.01); *H05K 1/0213* (2013.01)

(58) Field of Classification Search
CPC ..... H01Q 1/38; H01Q 21/065; H01Q 9/0407; H05K 1/0213; H05K 1/181
USPC .......................... 361/749, 752, 760, 764, 736
See application file for complete search history.

(56) References Cited

U.S. PATENT DOCUMENTS 6,195,049 B1    2/2001  Kim et al.
2002/0044276 A1*  4/2002  Stoner et al. ............... 356/141.1
(Continued)

FOREIGN PATENT DOCUMENTS

CN     101373218 A    2/2009
CN     101383343 A    3/2009
(Continued)

OTHER PUBLICATIONS

International Search Report for International Application No. PCT/EP2012/051737, dated Apr. 5, 2012, pp. 1-6.
(Continued)

*Primary Examiner* — Yuriy Semenenko
(74) *Attorney, Agent, or Firm* — Ditthavong & Steiner, P.C.

(57) ABSTRACT

A printed-circuit board arrangement electrically connects the at least one transmitter and/or receiver unit with at least one antenna element, whereas the at least one transmitter and/or receiver unit and the at least one antenna element are at least partially integrated into the printed-circuit board arrangement. In this context, the printed-circuit board arrangement includes different printed circuit boards, which are mechanically connected to one another in a rigid manner. A first part of the printed-circuit board arrangement is formed by at least one printed-circuit board, of which the substrate is made from a first material which is suitable for high-frequency, and a second part of the printed-circuit board arrangement is formed by at least one printed-circuit board, of which the substrate is made from a second material different from the first material, which is still sufficiently suitable for a low frequency and/or for a direct-voltage range.

17 Claims, 5 Drawing Sheets

(51) Int. Cl.
*H01Q 1/38* (2006.01)
*H01Q 9/04* (2006.01)
*H01Q 21/06* (2006.01)
*H05K 1/02* (2006.01)

(56) References Cited

U.S. PATENT DOCUMENTS

| | | |
|---|---|---|
| 2003/0080836 A1 | 5/2003 | Nagaishi et al. |
| 2004/0246168 A1 | 12/2004 | Isaji |
| 2005/0088260 A1 | 4/2005 | Ajioka et al. |
| 2008/0191956 A1 | 8/2008 | Watanabe |
| 2009/0066590 A1 | 3/2009 | Yamada et al. |
| 2009/0109109 A1 | 4/2009 | Franson et al. |
| 2009/0140948 A1* | 6/2009 | Yanagi et al. ............... 343/846 |
| 2009/0207090 A1 | 8/2009 | Pettus et al. |
| 2009/0251356 A1 | 10/2009 | Margomenos |
| 2010/0225539 A1 | 9/2010 | Margomenos et al. |

FOREIGN PATENT DOCUMENTS

| | | |
|---|---|---|
| DE | 601 31 643 T2 | 4/2009 |
| EP | 1280392 A1 | 1/2003 |
| EP | 2 144 329 A1 | 1/2010 |
| GB | 2 194 101 A | 2/1988 |
| JP | 11214916 A | 8/1999 |
| JP | 2002-43832 A | 2/2002 |
| JP | 2003133801 A | 5/2003 |
| JP | 2003332517 A | 11/2003 |
| JP | 2005505963 A | 2/2005 |
| JP | 2010256327 A | 11/2010 |
| WO | 02/082577 A1 | 10/2002 |
| WO | 2009002478 A2 | 12/2008 |

OTHER PUBLICATIONS

Japanese Office Action for related Japanese Patent Application No. 2013-555813 dated Jun. 9, 2015, 9 pages.

* cited by examiner

PRINTED-CIRCUIT BOARD ARRANGEMENT FOR MILLIMETER-WAVE SCANNERS

CROSS-REFERENCE TO RELATED APPLICATION

The present application is a national phase application of PCT Application No. PCT/EP2012/051737, filed on Feb. 2, 2012, and claims priority to German Application No. 10 2011 005 145.7, filed on Mar. 4, 2011, the entire contents of which are herein incorporated by reference.

BACKGROUND OF THE INVENTION

1. Field of the Invention

The invention relates to a printed-circuit board arrangement with at least one partially integrated transmitter and/or receiver unit and at least one antenna element, which preferably operates in the frequency range for millimeter waves.

2. Discussion of the Background

Printed-circuit board arrangements which can be used in the named context serve to establish electrical contact between the various transmitter and/or receiver units and the corresponding antenna elements, whereas the power supply for the corresponding transmitter and/or receiver units should be secured at the same time. In this context, the printed-circuit board arrangements should be designed so that the overall system can be structured as compactly as possible, and the undesirable emission of interference radiation is reduced to a minimum, whereas the interference immunity of the arrangement as a whole with regard to electromagnetic waves must be secured at the same time.

A printed-circuit board with at least a plurality of antenna elements and a transmitter and/or receiver unit is known from EP 2 144 329 A1. In this context, each antenna element is structured as a patch antenna, which can be excited via a slot with a feeding positioned beneath it. The antenna system operates in the millimeter-wave range.

The disadvantage with EP 2 144 329 A1 is that the printed-circuit board arrangement comprises exclusively substrates which are suitable for the highest frequencies, whereby the structure of the printed-circuit board arrangement becomes expensive.

SUMMARY OF THE INVENTION

Embodiments of the invention therefore provide a printed-circuit board arrangement and an associated millimeter wave scanner which can be manufactured in a more cost-effective manner.

According to embodiment of the invention, the high-frequency part is separated from the low-frequency part and the direct current part, so that any influence on the various parts is reduced as far as possible in order to increase the measurement accuracy. At the same time, only substrates, which are designed for high-frequencies should be used for the high-frequency part, whereas, for the low-frequency part or the direct current part, substrates should be used, of which the dielectric properties are sufficient for this range, in order to reduce manufacturing costs.

The printed-circuit board arrangement according to embodiments of the invention is used to establish electrical contact between at least one transmitter and/or receiver unit and at least one antenna element, whereas the at least one transmitter and/or receiver unit and the at least one antenna element are at least partially integrated in the printed-circuit board arrangement. In this context, the printed-circuit board arrangement comprises various printed circuit boards which are mechanically connected to one another in a rigid manner, whereas a first part of the printed-circuit board arrangement is formed by at least one printed-circuit board, of which the substrate is made from a first material, which is suitable for high-frequency, and a second part of the printed-circuit board arrangement is formed by at least one printed-circuit board, of which the substrate is made from a second material different from the first material, which is still sufficiently suitable for a low frequency and/or for a direct voltage range.

It is particularly advantageous if the printed-circuit board arrangement according to embodiments of the invention comprises various printed-circuit boards, whereas the material of the substrate of the first part of the printed-circuit board arrangement is suitable for high frequency, and the material of the substrate of the second part of the printed-circuit board arrangement is still sufficiently suitable for a low frequency and/or a direct-voltage range, and both materials differ from one another. Through the choice of different substrates, the printed-circuit board arrangement can ultimately be manufactured in an obvious more cost-favorable manner, whereas substrates for a low-frequency range and/or for a direct-voltage range are significantly more cost-effective than those which are suitable for applications with high frequencies.

Furthermore, an advantage is achieved with the printed-circuit board arrangement according to embodiments of the invention if both parts of the printed-circuit board arrangement are separated from one another by a ground plane. This prevents high-frequency signal components from coupling into the low-frequency range and/or in the direct voltage range and thereby falsifying the test signals.

An additional advantage is achieved with the printed-circuit board arrangement according to embodiments of the invention if the at least one antenna element and the at least one transmitter and/or receiver unit are formed in the first part of the printed-circuit board arrangement. This ensures that the high-frequency signal components do not couple in the part which is intended for the low-frequency signal component, being superposed over the test signal, for example, as an interference pulse.

A further advantage of the printed-circuit board arrangement according to embodiments of the invention is achieved if the transmitter and/or receiver chip is arranged directly on the ground plane, because this guarantees an effective heat removal.

Moreover, an advantage is achieved with the printed-circuit board arrangement according to embodiments of the invention if a horn element, which is drilled and/or milled and/or etched into an electrically conductive cover, is rigidly screwed and/or glued to the printed-circuit board arrangement above the at least one antenna element. Such a horn element increases the directional effect of the at least one antenna element in this context, thereby reducing the power consumption.

Integrating the horn element into a conductive cover ensures that an undesirable emission of the high-frequency signal is prevented and that a high-frequency signal cannot couple in the printed-circuit board arrangement.

Furthermore, an advantage is achieved with the printed-circuit board arrangement according to embodiments of the invention if an upper side of the electrically conductive cover is covered, with the exception of the recess for the horn element, with a damping mat and/or if an underside above the hollow cavity of the first part of the printed-circuit board arrangement is covered with a damping mat, because the amplitude of occurring standing waves and/or resonances is reduced by the damping mat, which leads to an increase in measurement accuracy.

A further advantage is achieved with the printed-circuit board arrangement according to embodiments of the invention if several via holes are arranged radially around the patch antenna and penetrate the first part of the printed-circuit board arrangement down to the ground plane. This ensures that no electromagnetic waves, which can possibly couple in neighboring antenna elements and/or transmitter and/or receiver units, propagate within the printed-circuit board arrangement.

Furthermore, it is particularly advantageous if the transmitter and/or receiver unit is connected to several antenna elements and if a plurality of antenna elements are arranged in a square on the printed-circuit board arrangement. With a plurality of such antenna elements, a sufficiently good spatial resolution is achieved.

Finally, it is advantageous with the printed-circuit board arrangement according to embodiments of the invention if several printed-circuit board arrangements each with at least one antenna element act together as an array, wherein a signal can be transmitted from precisely one antenna element of the entire array, and whereas a reflection of this signal can be received by all other antenna elements of the entire array which are connected to a receiver element. With such an expansion of an individual printed-circuit board arrangement to a system with several printed-circuit board arrangements, the range capable of being scanned can be enlarged in a very simple and cost-effective manner, or the resolution with which a range is scanned can be increased.

BRIEF DESCRIPTION OF THE DRAWINGS

By way of example, various exemplary embodiments of the invention are described below with reference to the drawings. The same subject matters are marked with the same reference numbers. The corresponding figures in the drawing are as follows in detail.

DETAILED DESCRIPTION OF EXEMPLARY EMBODIMENTS OF THE INVENTION

Figure 1:
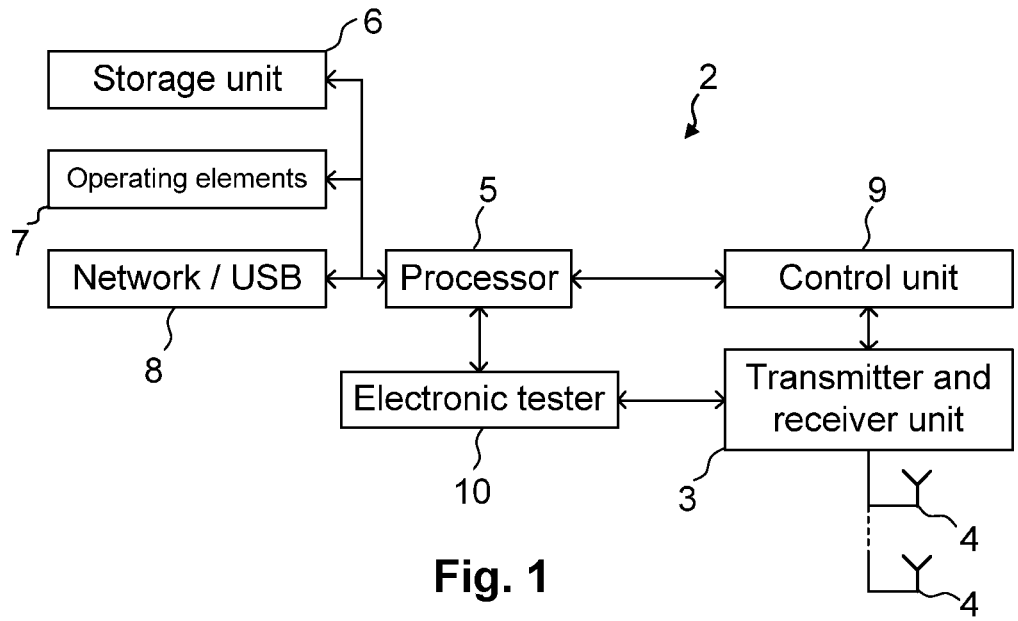
FIG. 1 shows a simplified block-circuit diagram of an exemplary embodiment for the operation of a millimeter-wave scanner, which contains the transmitter and/or receiver unit integrated into the printed-circuit board arrangement according to the invention and at least one antenna element.

FIG. 1 shows a simplified block-circuit diagram of an exemplary embodiment for the operation of a millimeter-wave scanner 2, which contains at least one transmitter and/or receiver unit 3 integrated into the printed-circuit board arrangement 1 according to the invention and the at least one antenna element 4. The millimeter-wave scanner 2 comprises a central data-processing unit 5, which is embodied in the form of a processor and/or an FGPA (field programmable gate array) and/or a digital signal processor. At least one storage unit 6, in which, for example, the test data and the operating system and the applications software are stored, is connected to the central data-processing unit 5. Furthermore, operating elements 7, such as a keyboard and/or buttons respectively keys and various interfaces 8, such as network connections and/or USB connections (universal serial bus) are also connected to the central data-processing unit 5.

Moreover, the central data-processing unit 5 is connected to a control unit 9 and the measurement electronic 10. The control unit 9 and the measurement electronic 10 are in turn connected to the transmitter and/or receiver unit 3. The control unit 9 can control the transmitter and/or receiver unit 3 and switch the latter, for example, on and/or off. Furthermore, the control unit 9 can also specify which antenna element 4 is controlled by the transmitter and/or receiver unit 3. The measurement electronic 10 contains all of the means for generating the necessary high-frequency signals (radio-frequency) and evaluating an intermediate frequency signal (intermediate frequency) received by a receiver unit 3. In this context, the transmitter and/or receiver unit 3 is connected to one or more antenna elements 4. A millimeter-wave scanner 2 can contain more than one transmitter and/or receiver unit 3, which are once again connected to the control unit 9 and the measurement electronic 10. All of the connections are otherwise electrically conductive connections over which data packets or analog test signals can be transferred.

The millimeter-wave scanner 2 preferably operates in the frequency range about 80 GHz. Such frequencies are preferably not generated directly in the measurement electronic 10 but in the transmitter and/or receiver unit 3 by means of at least one integrated mixer unit. In this context, the measurement electronic 10 preferably provides a signal with a frequency of approximately 20 GHz, which is quadrupled within the transmitter and/or receiver unit 3. The millimeter-wave scanner 2 can be used, for example, in order to analyse persons or goods more accurately.

The following section considers the problem of how the signal quadrupled to a frequency range of around 80 GHz can be efficiently transmitted from the transmitter and/or receiver unit 3 to the antenna elements 4 using the most cost-effective means possible.

Figure 2:
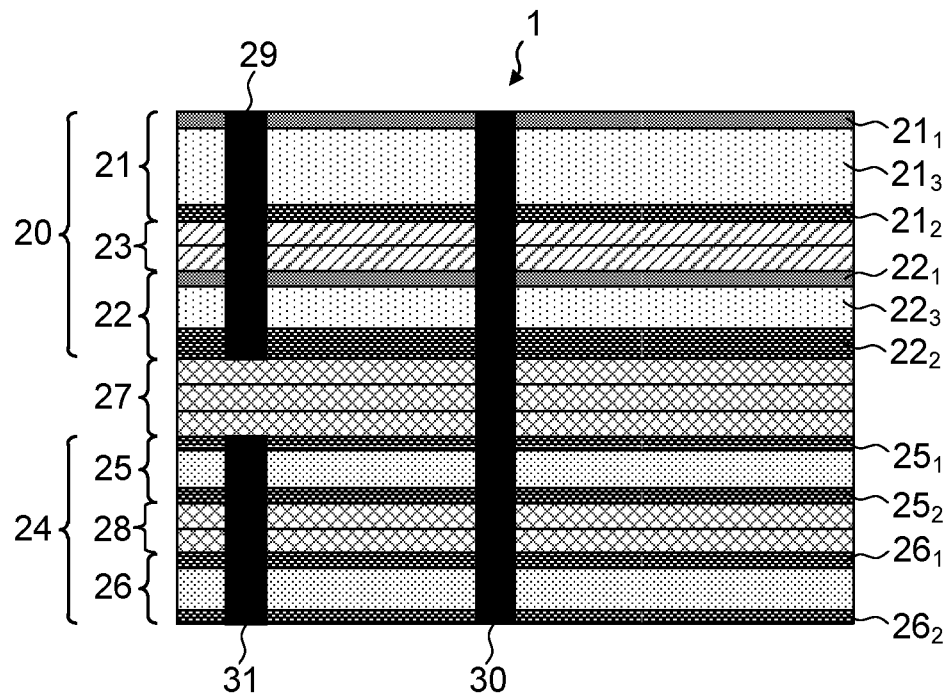
FIG. 2 shows an exemplary embodiment of a cross section through the printed-circuit board arrangement according to the invention.

For this purpose, FIG. 2 shows an exemplary embodiment of a cross section through the printed-circuit board arrangement 1 according to the invention. In the exemplary embodiment of FIG. 2, the printed-circuit board arrangement 1 according to the invention comprises two parts. A first part 20 in the exemplary embodiment comprises two individual printed circuit boards 21 and 22. The two printed circuit boards 21 and 22 contain a substrate $21_3$, $22_3$, which is in principle suitable for high frequencies. For frequencies in the millimeter-wave range, ceramics are normally used as the substrate material, because the strip conductors can be processed on the latter with higher precision. However, as will be explained in the following section, the structure of the printed-circuit board arrangement 1 according to the invention also allows the use of other substrate materials which are suitable for high frequencies, in order to operate the millimeter-wave scanner 2. By way of example, the substrate 4350B manufactured by Rogers can be used for the high-frequency compatible substrate $21_3$, $22_3$ of the individual printed-circuit boards 21 and 22 of the first part 20 of the printed-circuit board arrangement 1. The dielectric properties of this substrate are favorable for high-frequency applications.

An upper layer $21_1$ of the printed-circuit board 21 preferably comprises partially gold plated copper. This partially gold plated copper provides the advantage that the high-frequency electromagnetic waves are less strongly attenuated, and that this layer can be connected via bonding wires. By contrast, a lower layer $21_2$ of the printed-circuit board 21 of the first part 20 of the printed-circuit board arrangement 1 comprises normal copper. In this context, the layer thicknesses are within the usual range.

The second printed-circuit board 22 of the first part 20 of the printed-circuit board arrangement 1 preferably also comprises partially gold plated copper in its upper layer $22_1$. The lower layer $22_2$ of the printed-circuit board 22 comprises a normal copper layer, whereas the copper layer is very thick in comparison with the other copper layers. Experiments have shown that a copper layer, for example, of greater than approximately 100 μm achieves excellent results with regard to heat transport. This layer is also the ground plane $22_2$, which separates the high-frequency range from the low-frequency range respectively the direct-voltage range, as will be explained later.

The two printed-circuit boards 21 and 22 of the first part 20 of the printed-circuit board arrangement 1 are mechanically connected to one another in a rigid manner by an adhesive layer 23. This connection is reinforced by additionally pressing the two printed-circuit boards 21 and 22 together. This adhesive layer 23 must also provide a favourable behaviour with regard to high-frequency electromagnetic waves. For example, the material 4450B manufactured by Rogers can be used for this layer.

Alongside this first part 20 of the printed-circuit board arrangement 1, of which the substrates $21_3$, $22_3$ are made of a material which attenuates high-frequency electromagnetic waves less strongly, printed circuit boards 25 and 26, which are suitable only for low frequencies and direct voltages and cannot be used for high frequencies are used for the second part 24 of the printed-circuit board arrangement 1. In the exemplary embodiment from FIG. 2, the second part 24 of the printed-circuit board arrangement 1 is made from two printed circuit boards 25 and 26 in the same manner as the first part 20 of the printed-circuit board arrangement 1. Both printed circuit boards 25 and 26 are structured in an identical manner. The upper layer $25_1$ of the printed-circuit board 25 and the upper layer $26_1$ of the printed-circuit board 26, as well as the lower layer $25_2$ of the printed-circuit board 25 and the lower layer $26_2$ of the printed-circuit board 26 are made from copper of a standard thickness. The cost-effective FR4 material can be used for the printed-circuit boards 25 and 26. These materials respectively substrates are not suitable for high frequencies because the dielectric losses would attenuate them too strongly.

An intermediate layer 27 is positioned between the second printed-circuit board 22 of the first part 20 and the first printed-circuit board 25 of the second part 24 of the printed-circuit board arrangement 1. Such an intermediate layer 28 is also positioned between the first printed-circuit board 25 and the second printed-circuit board 26 of the second part 24 of the printed-circuit board arrangement 1. Both intermediate layers 27, 28 can be made from prepreg (pre-impregnated fibres). These intermediate layers 27, 28 are also unsuitable for high frequencies. In this context, the layer system illustrated in FIG. 2 of the printed-circuit board arrangement 1 according to the invention is compressed to a thickness of a few millimeters.

Various via holes are also illustrated by way of example in FIG. 2. A first via hole 29 connects the first printed-circuit board 21 to the second printed-circuit board 22 of the first part 20 of the printed-circuit board arrangement 1. A further via hole 30 connects the first part 20 of the printed-circuit board arrangement 1 to the second part 24. A via hole 31, which only connects the printed-circuit boards 25 and 26 of the second part 24 of the printed-circuit board arrangement 1 to one another is also provided. Moreover, via holes which do not reach to the surface (buried vias) can also be used. However, it should be noted that a minimum number of via holes connect the first part 20 of the printed-circuit board arrangement 1 to the second part 24 of the printed-circuit board arrangement 1, because as a result the shielding effect of the thick ground plane $22_2$ of the printed-circuit board 22 of the first part 20 of the printed-circuit board arrangement 1 is reduced.

Figure 3:
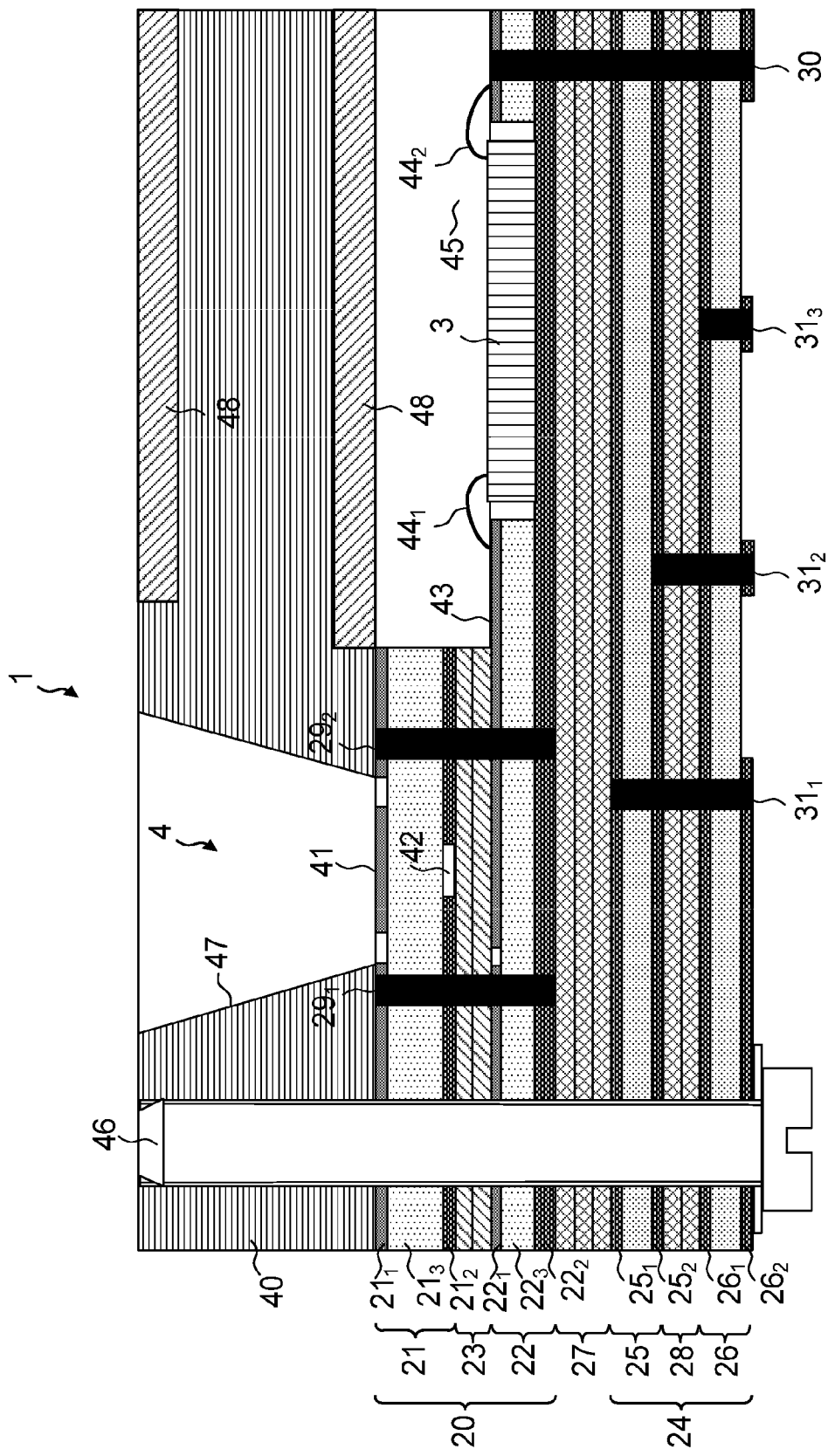
FIG. 3 shows an exemplary embodiment of a cross section through the printed-circuit board arrangement according to the invention, which contains the at least one antenna element, the transmitter and/or receiver unit and a cover.

FIG. 3 shows an exemplary embodiment of a section through the printed-circuit board arrangement 1 according to the invention, which contains the at least one antenna element 4, the transmitter and/or receiver unit 3 and a cover 40. The basic structure of the printed-circuit board arrangement 1 of FIG. 3 corresponds substantially to the structure of the printed-circuit board arrangement 1 of FIG. 2. In FIG. 3, the printed-circuit board arrangement 1 also comprises a first part 20 and a second part 24, wherein each part 20, 24 also comprises two printed circuit boards 21, 22 and 25, 26. In FIG. 3, the printed-circuit boards 21, 22 of the first part 20 are also suitable for high frequencies, whereas the printed circuit boards 25, 26 of the second part 24 are suitable for low frequencies, but not for high frequencies. The printed-circuit board arrangement 1 according to the invention is manufactured by gluing and/or pressing these different printed-circuit boards 21, 22 and 25, 26, whereas the use of the different materials within the substrates allows for a very cheap manufacture of the printed-circuit board arrangement 1.

The printed-circuit board arrangement 1 in this exemplary embodiment from FIG. 3 additionally comprises at least one antenna element 4 and at least one transmitter and/or receiver unit 3, which is formed as a transmitter and/or receiver chip 3. The at least one antenna element 4 and also the at least one transmitter and/or receiver unit 3 are placed in this context in the first part 20 of the printed-circuit board arrangement 1.

The at least one antenna element 4 is preferably an excited patch antenna 41. This patch antenna 41 is integrated in the upper layer $21_1$ of the first printed-circuit board 21 of the first part 20 of the printed-circuit board arrangement 1. This is preferably implemented through an etching process or a milling process. The patch antenna 41 is approximately dimensioned so that it is resonant in the required frequency range of the millimeter-wave scanner 2. As already explained, the patch antenna 41 preferably consists of partially gold plated copper. At least one slot 42 is formed in the lower layer $21_2$ of the first printed-circuit board 21 of the first part of the printed-circuit board arrangement 1. The patch antenna 41 is preferably excited via the slot 42 by a two coplanar striplines 43. As will be explained later, this two coplanar striplines 43 merge at their end into a dipole. The two coplanar striplines 43 are integrated through an etching process or a milling process into the upper layer $22_1$ of the second printed-circuit board 22 of the first part 20 of the printed-circuit board arrangement 1. Apart from twp coplanar striplines 43, also other types of transmission lines can be used to excite the patch antenna 41.

The two coplanar striplines 43, which are integrated in the upper layer $22_1$ of the second printed-circuit board 22, which is also made from partially gold plated copper, is electrically connected to the transmitter and/or receiver unit 3 via bonding wires $44_1$. The transmitter and/or receiver unit 3 is electrically connected to further strip conductors on the upper layer $22_1$ of the printed-circuit board 22 of the first part 20 of the printed-circuit board arrangement 1 by at least one further bonding wire $44_2$. A connection can then be established by means of this at least one bonding wire $44_2$ and the via hole 30 between the transmitter and/or receiver unit 3 and the second part 24 and there with the printed-circuit boards 25 respectively 26 of the printed-circuit board arrangement 1.

Furthermore, it is clearly evident that a cavity 45 is milled or punched into the printed-circuit board arrangement 1. This cavity 45 is preferably formed as a T-shape. Within this T-shaped cavity 45, the printed-circuit board 21 and the adhesive connection 23 are completely removed. The upper layer $22_1$ and the substrate $22_3$ of the second printed-circuit board 22 of the first part 20 of the printed-circuit board arrangement 1 are additionally removed over a given area within the cavity 45, whereas the area is large enough that the transmitter and/or receiver unit 3 can be inserted without difficulty into the latter and attached, especially glued, to the thick ground plane $22_2$, which also represents the lower layer $22_2$ of the second printed-circuit board 22. This means that the transmitter and/or receiver unit 3 respectively the transmitter and/or receiver chip 3 is positioned directly on the continous ground plane $22_2$ for improved heat removal.

Furthermore, the printed-circuit board arrangement 1 can also comprise a cover 40. This cover 40 is preferably made of a solid, electrically conductive material, which preferably is gold plated additionally. The cover 40 is placed directly onto the upper layer $21_1$ of the first printed-circuit board 21 of the first part 20 of the printed-circuit board arrangement 1 and mechanically connected to the latter in a rigid manner with a screw connection 46. Tightening this screw connection 46 also ensures that the upper layer $21_1$ is connected in an electrically conductive manner to the cover 40, which is further facilitated by the fact that both the upper layer $21_1$ and also the cover 40 are partially gold plated. The cover 40 also provides a recess with a conical shape, to which below will be referred as the horn element 47. The horn element 47 is inserted, especially drilled or milled and/or etched, into the electrically conductive cover 40. As illustrated in FIG. 3, the horn element 47 is arranged directly above the at least one antenna element 4. This means that the electromagnetic field radiated from the patch antenna 41 is subject to a certain directional characteristic.

It is also clearly evident that the electrically conductive cover 40 covers the entire upper layer $21_1$ of the first part 20 of the printed-circuit board arrangement 1 with the exception of the at least one antenna element 4. This ensures that apart from the at least one antenna element 4, no electromagnetic field is radiated, and in return, no interference radiation can couple into the printed-circuit board arrangement 1 from outside.

Furthermore, it is clearly evident that an upper side of the electrically conductive cover is also preferably completely covered, with the exception of the recess for the horn element 47, by a damping mat 48. This fact has not been illustrated in FIG. 3 for reasons of visual clarity. It is also possible that the underside of the electrically conductive cover 40, which is positioned above the cavity 45 in the first part 20 of the printed-circuit board arrangement 1, is covered by a damping mat 48. This achieves a reduction in the amplitude of standing waves.

It is also clearly evident that the at least one antenna element 4 is arranged inside a kind of cavity. On the one hand, this cavity comprises the via holes $29_1$ to $29_n$, and the thick ground plane $22_2$ respectively the lower surface $22_2$ of the second printed-circuit board 22 of the first part 20 of the printed-circuit board arrangement 1. Moreover, this cage continues in the electrically conductive cover 40. As will be explained further with regard to the other figures from the drawings, the through-contacts $29_1$ to $29_n$ serve to prevent the electromagnetic wave of the antenna element 4 from propagating within the printed-circuit board structure 1. The thick ground plane $22_2$ also ensures that the electromagnetic wave radiated from the two coplanar striplines 43 is reflected in the direction of the slot 42 respectively in the direction of the patch antenna 41. In this context, it is also readily evident that, because of the thick ground plane $22_2$, the high-frequency part, which can be allocated to the first part 20 of the printed-circuit board arrangement 1, is completely separated from the low-frequency part, which can be allocated to the second part 24 of the printed-circuit board arrangement 1.

The various ground layers $25_1$, $25_2$, $26_1$ and $26_2$ of the printed circuit boards 25 and 26 in the second part 24 of the printed-circuit board arrangement 1 are interconnected by the via holes $31_1$, $31_2$ and $31_3$. By contrast, it is not illustrated in FIG. 3 that a plug connection, by means of which the printed-circuit board arrangement 1 can be connected to a control unit 9 or a measurement electronic 10, can also be placed on the underside of the second printed-circuit board 26.

Figure 4:
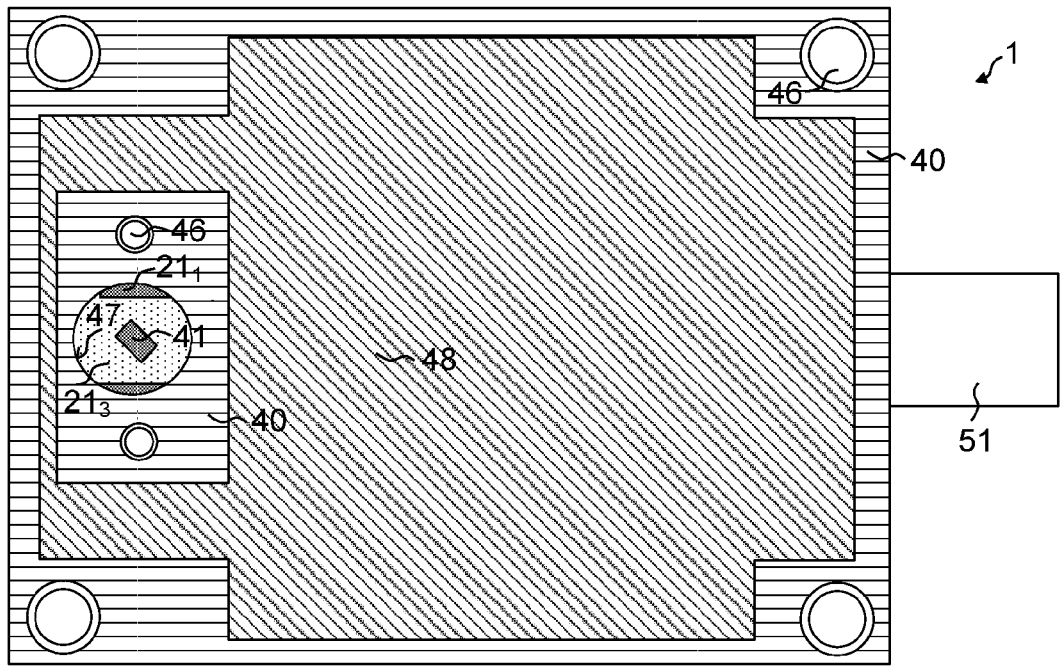
FIG. 4 shows an exemplary embodiment of a plan view of the printed-circuit board arrangement according to the invention with a cover and an antenna element.

FIG. 4 shows an exemplary embodiment of a plan view of the printed-circuit board arrangement 1 according to the invention with a cover 40 and an antenna element 4. Clearly evident is the damping mat 48, which for reasons of improved visual clarity does not enclose the entire cover 40 with the exception of the recess for the horn element 47. The screw connections 46, by means of which the cover 40 is connected in a mechanically rigid and electrically conductive manner to the printed-circuit board arrangement 1, are also illustrated. Similarly, the patch antenna 41 and parts of the upper layer $21_1$ of the first printed-circuit board 21 of the first part 20 of the printed-circuit board arrangement 1 can be seen in this plan view. Parts of the upper layer $21_1$ have been removed by an etching process or milling process, so that the underlying substrate $21_3$ of the printed-circuit board 21 appears. For example, a coaxial plug 51, by means of which the high-frequency signal can be supplied to the transmitter and/or receiver unit 3, is still visible on the right-hand side.

Figure 5:
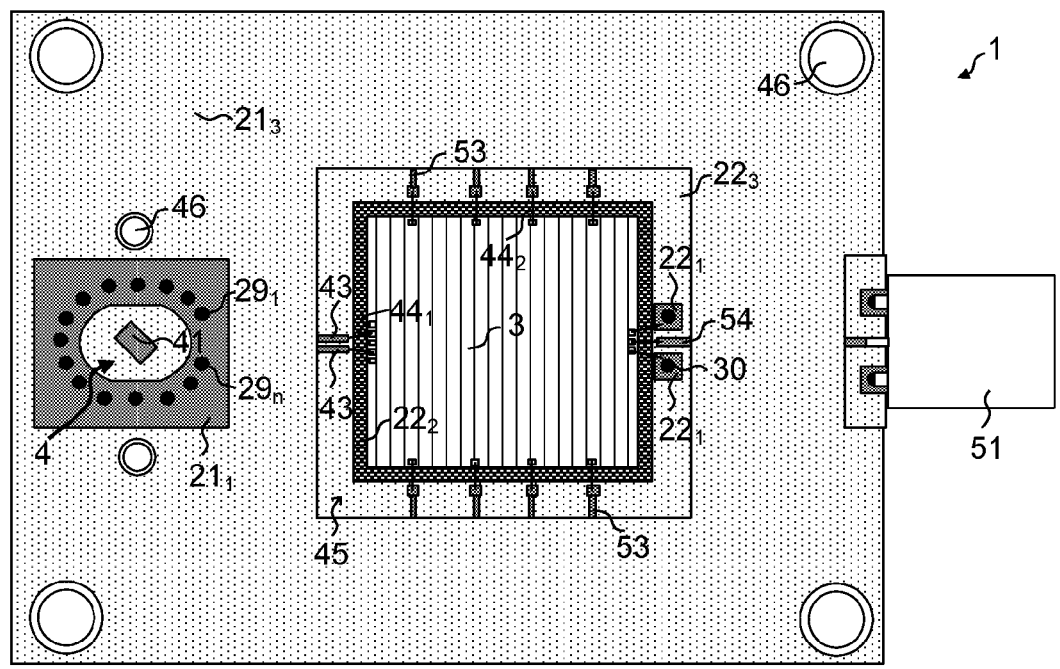
FIG. 5 shows an exemplary embodiment of a plan view of the printed-circuit board arrangement according to the invention with a cover removed, an antenna element and a transmitter and/or receiver element.

FIG. 5 shows an exemplary embodiment of a plan view of the printed-circuit board arrangement 1 according to the invention with a cover 40 removed, antenna element 4 and a transmitter and/or receiver unit 3. The via holes $29_1$ to $29_n$ are clearly evident in FIG. 5. As already explained, these via holes $29_1$ to $29_n$ are used, on the one hand, to connect the horn element 47 as well as possible to the reference ground, while at the same time, they fulfil the object of preventing a propagation of the electromagnetic wave radiated from the antenna element 4 within the printed-circuit board arrangement 1. The fact that several of these through-contacts $29_1$ to $29_n$ are arranged radially around the patch antenna 41 and that these penetrate the first part 20 of the printed-circuit board arrangement 1 down to the continous thick ground plane $22_2$ is also illustrated. In the exemplary embodiment from FIG. 5, the upper layer $21_1$ of the first printed-circuit board 21 has been largely etched away or milled away. However, it is quite possible for the upper layer $21_1$ of the first printed-circuit board 21 to cover the substrate $21_3$ completely with the exception of a region around the patch antenna 41 and the transmitter and/or receiver unit 3.

Also evident is the milled and/or punched cavity 45, in which the transmitter and/or receiver unit 3 is integrated. It is also shown that the transmitter and/or receiver unit 3 is realised in the form of a transmitter and/or receiver chip 3 and placed onto the thick ground plane $22_2$ respectively glued to the latter in a rigid manner. In the plan view of FIG. 5, the thick ground plane $22_2$ is also surrounded by the substrate $22_3$ of the second printed-circuit board 22 of the first part 20 of the printed-circuit board arrangement 1. It is clearly evident that the two coplanar striplines 43, which are used for the excitation of the patch antenna 41, are positioned on the second substrate $22_3$. In addition, further strip conductors, which are used for the power supply or for controlling of the transmitter and/or receiver unit 3 or by means of which the intermediate frequency signal is transferred to the measurement electronic 10, are also positioned on this substrate $22_3$. Another strip conductor 54, by means of which for example a high-frequency signal, supplied from outside, is routed to the transmitter and/or receiver unit 3, is also clearly evident.

Figure 6:
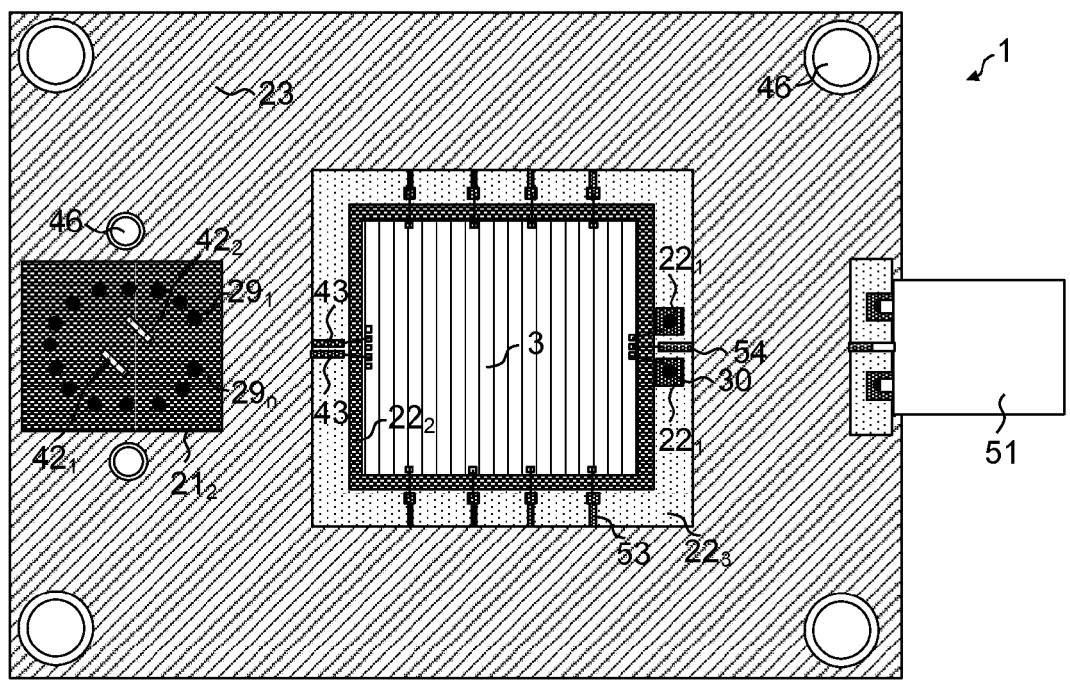
FIG. 6 shows an exemplary embodiment of a plan view of the underside of a first printed-circuit board within the first part of the printed-circuit board arrangement according to the invention.

FIG. 6 shows an exemplary embodiment of a plan view of the lower layer $21_2$ of a first printed-circuit board 21 within the first part 20 of the printed-circuit board arrangement 1 according to the invention. The glued connection 23, which serves as the mechanically stable connection of the two printed-circuit boards 21 and 22 in the first part 20 of the printed-circuit board arrangement 1 is clearly evident. The lower layer $21_2$ of the first printed-circuit board 21, which is made from copper, is formed only in a small region, although this would also be possible over the entire layer of the glued connection 23. In this exemplary embodiment, two rectangular slots, for example, $42_1$, $42_2$, are formed within this lower layer $21_2$. In the plan view, these two slot-shaped recesses in the lower copper layer $21_2$ allow for a view of the glued layer 23 positioned beneath them. The via holes $29_1$ to $29_n$ are also clearly evident. As in FIG. 5, the transmitter and/or receiver unit 3 with corresponding connecting lines, for example, the two coplanar striplines 43 is also illustrated in FIG. 6. Here also, the thick ground plane $22_2$, which at the same time forms the lower layer $22_2$ of the second printed-circuit board 22 of the first part 20 of the printed-circuit board arrangement 1, is also clearly evident.

Figure 7:
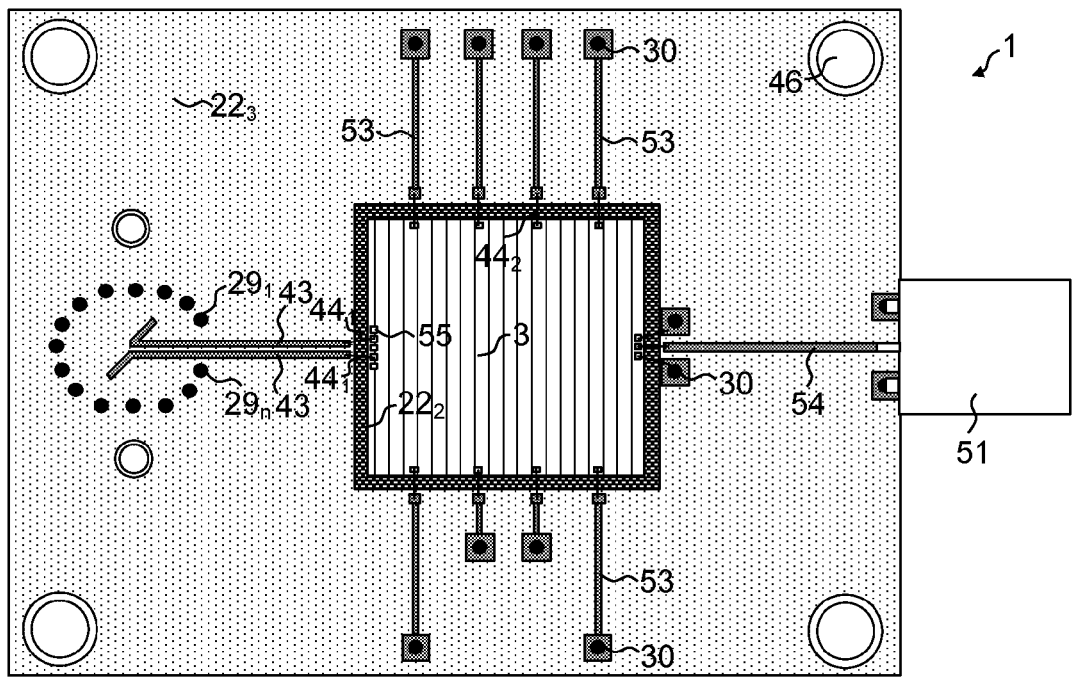
FIG. 7 shows an exemplary embodiment of a plan view of the upper side of a second printed-circuit board within the first part of the printed-circuit board arrangement according to the invention.

FIG. 7 shows an exemplary embodiment of a plan view of the upper layer $22_1$ of the second printed-circuit board 22 within the first part 20 of the printed-circuit board arrangement 1 according to the invention. The two gold plated coplanar striplines 43, of which the ends merge into a dipole, and the substrate $22_3$ positioned beneath them are clearly evident. The via holes $29_1$ to $29_n$ are also evident, whereas it is particularly advantageous that there is no via hole in the region of the feeding of the two coplanar striplines 43. The thick ground plane $22_2$ positioned beneath the substrate $22_3$, which also forms the lower layer $22_2$ of the second printed-circuit board 22, ensures that the electromagnetic field transmitted by the dipole of the two coplanar striplines 43 is reflected in the direction towards the patch antenna 41. As already explained, the via holes $29_1$ to $29_n$ ensure that the electromagnetic field does not propagate within the printed-circuit board arrangement 1 thereby causing measurement errors.

Moreover, the strip conductors 53, which are electrically connected to the via holes 30 and connect the transmitter and/or receiver unit 3 to the second part 24 of the printed-circuit board arrangement 1, are clearly evident. The strip conductor 54, which connects the transmitter and/or receiver unit 3 to the coaxial connector 51, is also very clearly evident. As already explained, a high-frequency signal, which is upconverted within the transmitter and/or receiver unit 3 to the desired frequency, can be supplied from outside via the coaxial connector 51. The transmitter and/or receiver unit 3 is glued to the thick ground plane $22_2$ in order to achieve a favorable thermal resistance. The transmitter and/or receiver unit 3 further comprises gold plated connecting contacts 55, which in turn are electrically connected via bonding wires $44_1$, $44_2$ to the corresponding strip conductors on the upper layer $22_1$ of the second printed-circuit board 22 of the first part 20 of the printed-circuit board arrangement 1.

Figure 8:
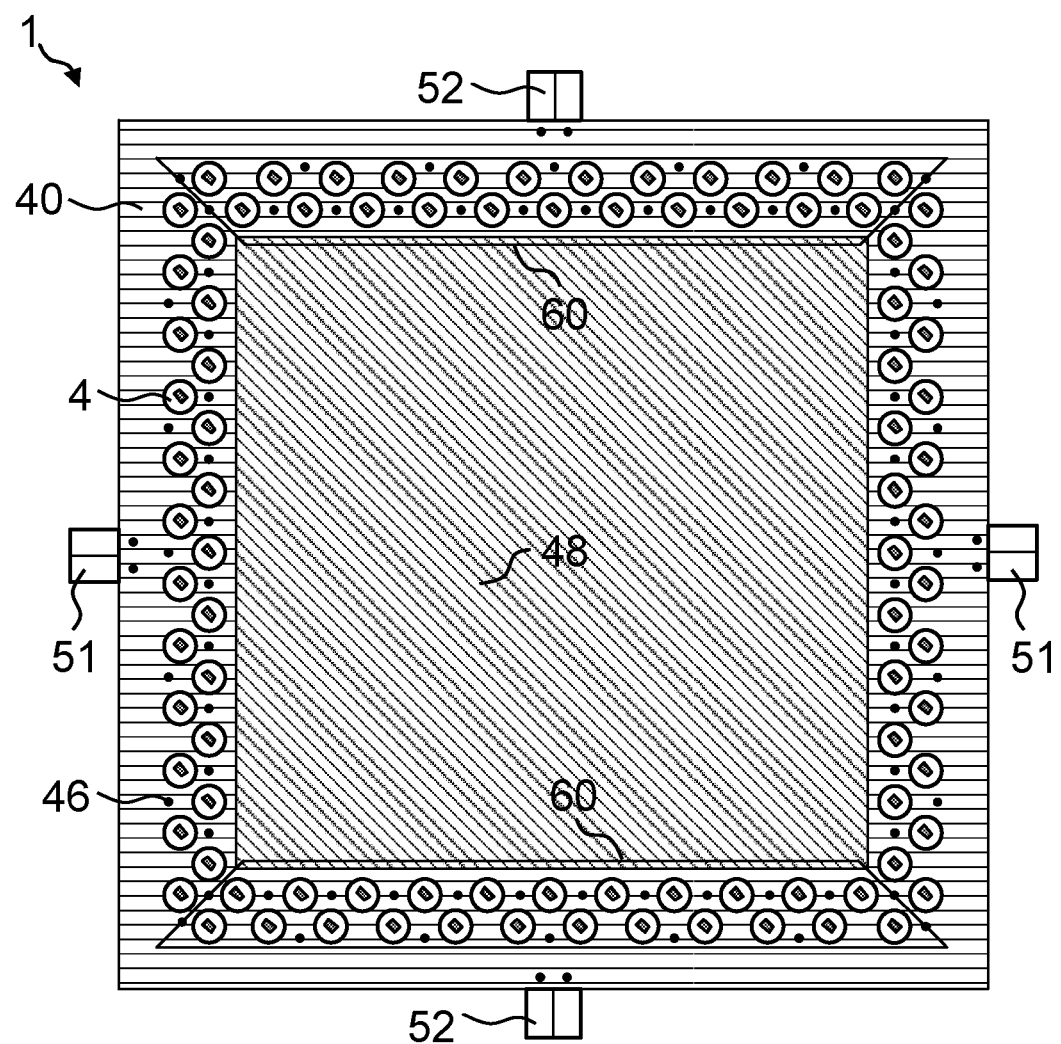
FIG. 8 shows an exemplary embodiment of a plan view of the printed-circuit board arrangement according to the invention with a cover and a plurality of antenna elements.

FIG. 8 shows a further exemplary embodiment of a plan view of the printed-circuit board arrangement 1 according to the invention with a cover 40 and a plurality of antenna elements 4. In the exemplary embodiment of FIG. 8, the damping mat 48 is formed in the area between the antenna elements 4. A solid cover 40 in which 92 horn elements 47 have been drilled or milled and/or etched is clearly evident. In this context, this plurality of antenna elements 4 is arranged in a square on the printed-circuit board arrangement 1. Each antenna element 4 is preferably connected either to a transmitter unit or to a receiver unit.

For example, four antenna elements 4, which are arranged in the region 60, can each be connected to a transmitter unit, while, also, for example, four antenna elements 4, which are not positioned in the region 60, are each connected to a receiver unit. In this context, the control unit 9 can specify that only one antenna element 4 connected to a transmitter unit transmits an electromagnetic wave at each time, and, at the same time, that the electromagnetic wave, which is received by the antenna elements 4 which are connected to a receiver unit, is evaluated by the measurement electronic 10. In the next step, the same procedure is repeated for another antenna element 4 which as well is connected to a transmitter unit. For this purpose, all of the patch antennas 41 are preferably orientated in the same direction.

It is particularly advantageous that several of the printed-circuit board arrangements 1 shown in FIG. 8 in each case with at least one antenna element 4 can be operated together as an array (group of antennas). Accordingly, precisely one antenna element 4 of the overall array transmits a signal at a given time, whereas all other antenna elements 4 of the same array, which are connected to a receiver unit, optionally receive a reflection of this signal, which is then evaluated by the measurement electronic 10. As a result of this particularly advantageous interconnection of several printed-circuit board arrangements 1, a large spatial region can be investigated, without the need to change the spatial position of the printed-circuit board arrangement 1.

The high-frequency signals supplied via the coaxial plugs 51, 52 can be split, for example, by Wilkinson dividers, and routed to different transmitter and receiver units. Within the scope of the invention, all of the features described and/or illustrated can optionally be combined with one another.

The invention claimed is:

1. A printed-circuit board arrangement for the electrical connection of at least one transmitter and/or receiver unit with at least one antenna element, wherein the at least one transmitter and/or receiver unit and the at least one antenna element are at least partially integrated in the printed-circuit board arrangement, wherein the printed-circuit board arrangement comprises different printed circuit boards, which are mechanically connected to one another in a rigid manner, wherein a first part of the printed-circuit board arrangement is formed by at least one printed-circuit board, of which a substrate is made from a first material, which is suitable for high-frequency, and a second part of the printed-circuit board arrangement is formed by at least one printed-circuit board of which a substrate is made from a second material different from the first material, which is suitable only for a low frequency or for a direct voltage range, wherein at least one cavity in which the transmitter and/or receiver unit is integrated, is milled and/or punched in the first part of the printed-circuit board arrangement, and wherein, with the exception of a recess for a horn element, an upper surface of an electrically conductive cover is covered by a damping mat and/or an underside of the electrically conductive cover above the cavity of the first part of the printed-circuit board arrangement is covered by a damping mat.

2. The printed-circuit board arrangement according to claim 1,
wherein the at least one antenna element and the at least one transmitter and/or receiver unit are formed in the first part of the printed-circuit board arrangement.

3. The printed-circuit board arrangement according to claim 1,
wherein both parts of the printed-circuit board arrangement are separated from one another by a ground plane.

4. The printed-circuit board arrangement according to claim 3,
wherein the transmitter and/or receiver unit is positioned directly on the ground plane for improved heat removal.

5. The printed-circuit board arrangement according to claim 1, wherein above the at least one antenna element the horn element is positioned, integrated into the electrically conductive cover, drilled and/or milled and/or etched, and the electrically conductive cover is screwed and/or glued to the printed-circuit board arrangement in a rigid manner.

6. The printed-circuit board arrangement according to claim 5,
wherein the electrically conductive cover covers an entire surface of the first part of the printed-circuit board arrangement with the exception of the at least one antenna element.

7. The printed-circuit board arrangement according to claim 1,
wherein the at least one antenna element provides a patch antenna, which can be excited via two striplines connected to the transmitter and/or receiver unit.

8. The printed-circuit board arrangement according to claim 7,
wherein a ground plane, in which at least one slot is integrated, is integrated between the patch antenna and the two striplines.

9. The printed-circuit board arrangement according to claim 7,
wherein both parts of the printed-circuit board arrangement are separated from one another by a ground plane, and
wherein several via holes are arranged radially around the patch antenna and penetrate the first part of the printed-circuit board arrangement down to the ground plane.

10. The printed-circuit board arrangement according to claim 9,
wherein no via hole is present in the region of the feeding of the two striplines.

11. The printed-circuit board arrangement according to claim 1,
wherein the low-frequency range and/or the direct-voltage range of the transmitter and/or receiver unit is connected by via holes to the at least one printed-circuit board of the second part of the printed-circuit board arrangement.

12. The printed-circuit board arrangement according to claim 1,
wherein the transmitter and/or receiver unit is a transmitter and/or receiver chip, of which the connecting contacts are connected to the at least one printed-circuit board of the first part of the printed-circuit board arrangement especially via bonding wires.

13. The printed-circuit board arrangement according to claim 1,
wherein a plug connection, by which the at least one transmitter and/or receiver unit is connected to a control unit and/or a measurement electronic, is arranged on an underside of the printed-circuit board arrangement.

14. The printed-circuit board arrangement according to claim 1,
wherein the transmitter and/or receiver unit is connected to several antenna elements and/or a plurality of antenna elements are arranged in a square on the printed-circuit board arrangement.

15. The printed-circuit board arrangement according to claim 14,
wherein each antenna element is connected either to a transmitter unit or to a receiver unit, and, at a given time, a signal can only be transmitted via a given antenna element connected to a transmitter unit.

16. A millimeter-wave scanner with several printed-circuit board arrangements according to claim 1,
wherein the printed-circuit board arrangements each with at least one antenna element each together form an array, wherein a signal can be transmitted from precisely one antenna element of the overall array, and wherein, for all other antenna elements of the overall array, which are connected to a receiver unit, a reflection of this signal can be received.

17. The printed-circuit board arrangement according to claim 1,
wherein the at least one antenna element provides a patch antenna, which can be excited via two coplanar striplines connected to the transmitter and/or receiver unit.

* * * * *